PRINTED CIRCUIT DELAY LINE HAVING MUTUALLY
OPPOSED, SPIRALLED, INDUCTANCE ELEMENTS

Filed Dec. 27, 1966

INVENTORS.
JOHN R. ANDREWS, JR.
PHILIP A. GOLDMAN
CHESTER M. NIBBY, JR.
BY Richard J. Donahue
ATTORNEY

United States Patent Office 3,436,687

Patented Apr. 1, 1969

3,436,687

PRINTED CIRCUIT DELAY LINE HAVING MUTUALLY OPPOSED, SPIRALLED, INDUCTANCE ELEMENTS

John R. Andrews, Jr., and Philip A. Goldman, Framingham, and Chester M. Nibby, Jr., Saugus, Mass., assignors to Honeywell Inc., Minneapolis, Minn., a corporation of Delaware Filed Dec. 27, 1966, Ser. No. 604,732

Int. Cl. H03h 7/30

U.S. Cl. 333—29 5 Claims

ABSTRACT OF THE DISCLOSURE

A lumped parameter delay line of special construction having a cascaded series of *m*-derived T network filter sections. Each section includes a pair of inductive elements in the form of flat spiral coils disposed in axial alignment on opposite sides of an insulative board, the inner ends of the coils being joined through the board. Each section further includes a capacitor connected between the junction of its paired coils and a conductive strap common to all such sections. The paired spiral coils of a section evolve from their commn axis in opposite directions, as viewed from one side of the board, to provide a positive coefficient of coupling therebetween. Intermediate filter sections are cascaded by having the outer ends of their paired coils extended to join the outer ends of the paired coils of the adjacent delay sections.

*Background of the invention*

The present invention relates in general to signal transmission apparatus and in particular to a lumped parameter delay line of improved printed circuit construction.

Lumped parameter delay lines, per se, are well known in the electronics art. The design equations, response curves and operational characteristics for such devices are set forth in numerous publications, as for example in the text entitled "Pulse, Digital and Switching Waveform," by Jacob Millman and Herbert Taub, McGraw-Hill Book Company, 1965, on pages 800–808. One form of a lumped parameter delay line which exhibits superior electrical characteristics consists of a cascaded series of *m*-derived T network filter sections, each section including a pair of inductors connected in series between an input and an output lead of the section, and a capacitor connected between the junction of the inductors and a common input-output lead of the section. The paired inductors of each filter section are physically arranged so as to have mutual inductance therebetween. With a properly chosen coefficient of coupling between the paired inductors of each filter section, the *m*-derived delay line exhibits a substantially constant delay for all signal frequencies within its passband of operation. As compared to delay lines formed of constant-*k* filter sections, which lack such mutual coupling of inductors, the *m*-derived delay line provides an improved step voltage response and requires fewer filter sections for a given ratio of delay time to rise time of a pulse.

Thus far, *m*-derived delay lines, i.e., delay lines having a cascaded series of *m*-derived filter sections, have been constructed with inductors formed of conventional wire coiled about a rod, the paired inductors of a filter section being spaced along the rod at a distance which provides the desired coefficient of coupling therebetween. Not only are such devices physically large and expensive to fabricate, but they exhibit electrical parameters which vary appreciably from section to section within the delay line. This is the case since it is difficult to accurately control the shape and dimensions of the paired inductors and the critical spacing therebetween.

While there exist delay lines of printed circuit construction, in which the shape of the individual inductors is predictable, they are not of the *m*-derived type, generally having but one inductor per filter section. See for example, U.S. Patents 3,141,144, entitled "Printed Circuit Delay Line," filed Feb. 10, 1961 and issued July 14, 1964. See also the IBM Technical Disclosure Bulletin, volume 8, No. 5, October 1955, entitled "Printed Delay Line," by E. J. Altmann and J. M. Huenman. Such printed circuit delay lines have the topological problem of making contact to the inner end of each spiral inductor for the purpose of cascading filter sections. This is accomplished by providing a bridging strap on the bottom surface of the printed circuit board, or by providing an insulative bridge and cross-over strap above the exposed surface of the inductors. The aforementioned solutions to this problem are wasteful of board space and are expensive to implement. Most importantly, however, the resulting delay lines do not provide the superior electrical characteristics of the *m*-derived delay line mentioned above.

*Summary of the invention*

It is therefore an object of the present invention to provide signal transmission apparatus of improved construction.

It is a more specific object of the present invention to provide an *m*-derived T network delay line of printed circuit construction.

In summary, the present invention concern a signal transmission line, such as a lumped parameter delay line, having a cascaded series of *m*-derived filter sections. Each section includes a pair of flat spiral coils disposed for mutual coupling on opposite sides of an insulative board, the inner ends of the paired coils being joined through the board. The individual filter sections are cascaded by joining the outer ends of their paired coils on the board. Each section further includes a capacitor connected between the junction of its paired coils and a common input-output terminal of the line. A signal output terminal may be provided for each filter section at the junction of its paired coils.

*Description of the preferred embodiment*

Figure 1:
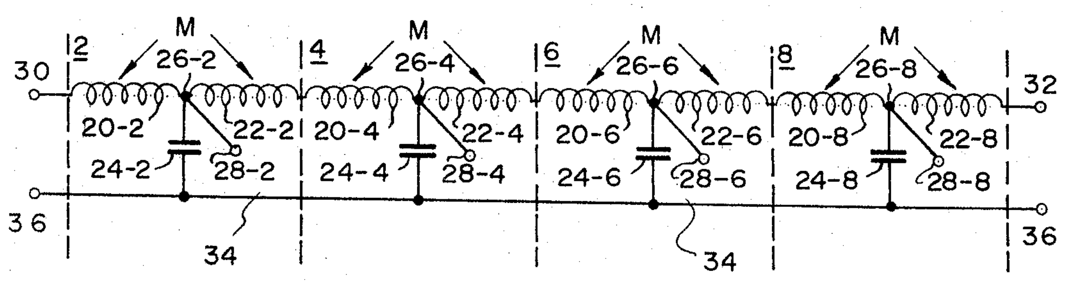
FIGURE 1 is a diagrammatic illustration of an *m*-derived T network delay line.

Referring more particularly to FIGURE 1, the delay line includes four *m*-derived T network filter sections 2, 4, 6 and 8. Although four filter sections are shown in the drawing, it will be understood that any number of filter sections can be similarly cascaded to provide the delay steps and total delay time required for a particular application. Since the filter sections are identical in construction and operation, corresponding elements of each section have the same prefix numeral and the suffix numeral of their related section.

Each of the filter sections 2, 4, 6 and 8 includes a pair of inductors 20, 22 and a capacitor 24, each having one lead thereof connected at a junction 26. A delay tap terminal 28 is also provided at each junction 26. Each filter section has the free lead of its inductor 20 connected to the free lead of the inductor 22 of the preceding section. The free lead of the first inductor 20–2 is connected to the input terminal 30 of the delay line while the free lead of the last inductor 22–8 is connected to the output terminal 32 of the delay line. Each of the capacitors 24 has its other lead connected to a lead 34 which extends between the common input-output terminals 36 of the delay line. The paired inductors 20 and 22 of each section are arranged to have mutual inductance therebetween, as indicated by the symbol M.

The theory of operation of the delay line described above is well known and need not be described here in detail. It is sufficient to note that a pulse applied across the input terminals 30, 36 will be propagated through the cascaded filter sections appearing at successively later times at the delay tap terminals 28–2, 28–4, etc., and thence across the output terminals 32, 36. The electrical characteristics of each filter section, such as its delay time, characteristic impedance, frequency passband and step voltage response are related to the values of its inductive and capacitive components and the coupling between its inductive components.

Figure 2:
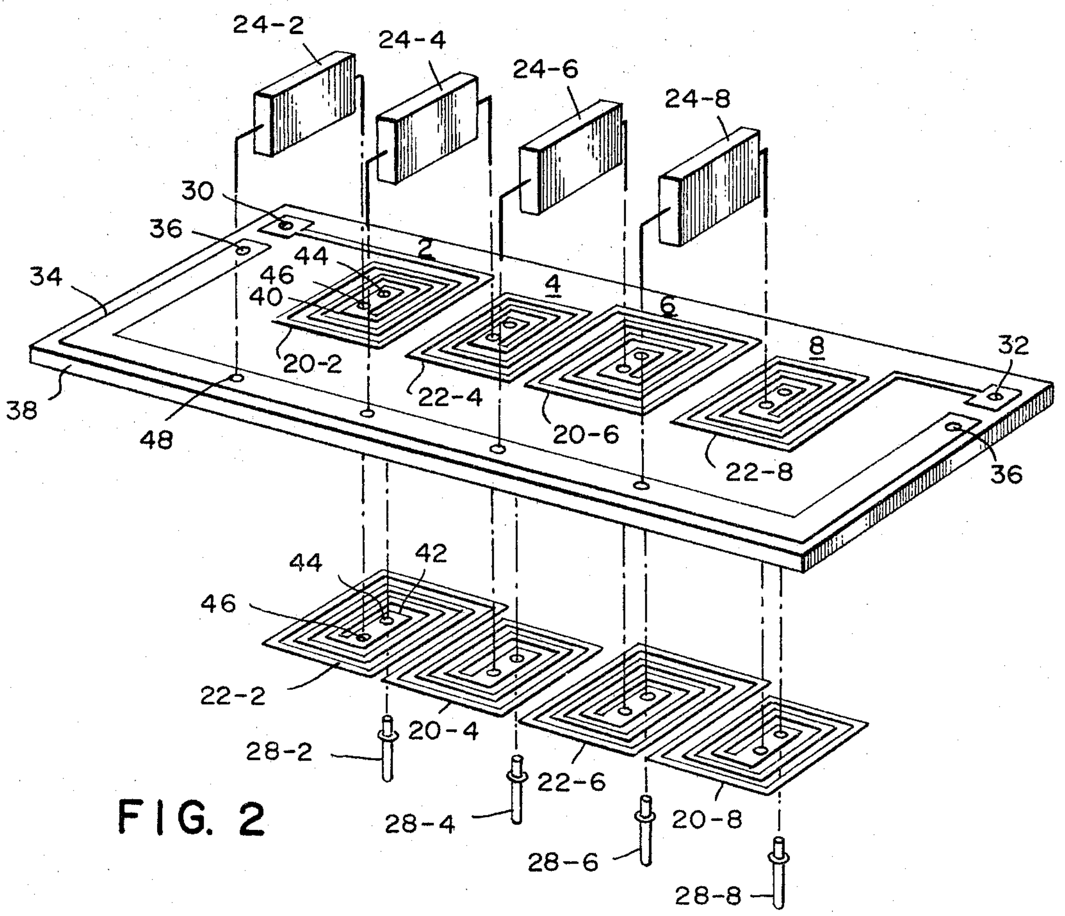
FIGURE 2 is a partially exploded assembly drawing of the delay line of FIGURE 1 constructed in accordance with the teachings of the present invention.

Referring now to FIGURE 2 of the drawing, there is shown a partially exploded assembly drawing of the delay line of FIGURE 1 constructed in printed circuit form according to the teachings of the present invention. The sections, components, terminals etc. which correspond to those shown in FIGURE 1 bear the same reference indicia. The delay line includes an insulative support member 38 having substantially flat spiral coils formed on opposite sides thereof. The spiral coils may be separately formed and thereafter affixed to the support member 38. Preferably however, the support member 38 is a printed circuit board of the type initially having thin sheets of copper foil bonded to opposite sides thereof, the spiral coils being formed by the removal of the excess foil material by known printed circuit processes.

The paired spiral coils 20 and 22 of each filter section are positioned in axial alignment for mutual coupling on opposite sides of the support member 38 and have their inner ends connected therethrough. In the filter section 2, for example, the coil 20–2 is positioned on the upper side of the support member 38 and has its coil turns spiralling inwardly in a clockwise direction. The inner end 40 of the coil 20–2 is enlarged in the vicinity of its coil axis. The coil 22–2 is positioned on the lower side of the support member 38, directly below the coil 20–2, and has its coil turns spiralling inwardly in a counterclockwise direction as viewed from the upper side of the support member 38. The inner end 42 of the coil 22–2 is enlarged in the vicinity of its coil axis. A pair of holes 44 and 46 are formed through the inner end 40 of the coil 20–2, through the support member 38, and thence through the inner end 42 of the coil 22–2. A flanged delay tap pin 28–2 is inserted through the hole 44 to join the inner ends 40, 42 of the coils 20–2, 22–2. The capacitor 24–2 of filter section 2 has a first lead inserted through the hole 46 to further join the inner ends of the coils 20–2 and 22–2. The other lead of capacitor 24–2 is inserted in a hole 48 formed in the conductive strap 34 which extends between the common input-output terminals 36 of the delay line. The paired coils 20, 22 of each of the remaining filter sections, have their inner ends joined through the support member 38 by means of their related capacitor 24 and delay tap pin 28.

The outer end of the coil 20–2 is extended on the upper side of the support member 38 to join the input terminal 30 of the delay line. The outer end of the coil 22–2 is extended on the lower side of the support member 38 to join the outer end of the adjacent coil 20–4. The coils 22–2 and 20–4 are preferably spiralled in the same direction, as shown in FIGURE 2. The coil 22–4 is positioned on the upper side of the support member 38, directly above the coil 20–4, and has its coil turns spiralled in a clockwise direction so as to provide a positive coefficient of coupling therebetween. The outer end of the coil 22–4 is extended on the upper side of the support member 38 to join the outer end of the adjacent coil 20–6. The paired coils 20, 22 of the filter sections 6 and 8 are physically arranged and interconnected on the support member 38 in the same manner as the paired coils 20, 22 of the filter sections 2 and 4. The outer end of the coil 22–8 is extended to join the output terminal 32 of the delay line.

As can be seen from the foregoing description, the invention provides an $m$-derived delay line which is inexpensively fabricated in printed circuit form. The shape of the individual coils, including their turn width and turn spacing is precisely controlled thus assuring their value of self-inductance. In addition, the mutual coupling between the paired coils 20, 22 of each filter section is stabilized by their fixed separation and alignment on opposite sides of the support member 38.

In the preferred form of the invention shown in FIGURE 2, the paired coils 20 and 22 of each filter section are substantially square in shape, to take full advantage of the available surface area of the support member 38. It will be obvious, however, that the coils may take any desired spiral form. While the paired coils of a section are shown to be disposed in axial alignment on opposite sides of the member 38, it is only necessary that there be a sufficient overlapping of their coil turns to provide the required coefficient of coupling therebetween. While it is preferred that the coils of adjacent filter sections which are joined together on the same side of the support member 38, such as for example the coils 22–4 and 20–6, be spiralled in the same direction, they may if desired be spiralled in opposite directions. Once the apparatus has been assembled and connected in the manner set forth above, it may be used as a signal transmission line for signal delay purposes, or other like purpose, well known in the art.

Having now described the invention, what is claimed as new and novel and for which it is desired to secure Letters Patent is:

1. A signal transmission line comprising a flat support member having a pair of parallel sides and formed of an insulating material, the thickness dimension of said member between said parallel sides being relatively small, a first flat spiral coil positioned on one of said sides, said coil having an outer spiral end and an inner spiral end, a second flat spiral coil positioned on the other one of said sides, said second coil having an outer spiral end and an inner spiral end, said second coil being formed with the turns thereof spiralled in the opposite direction from the turns of said first coil, as viewed from the same side of said support member, and positioned to be inductively coupled to said first coil through said support member, a first connection means coupling said inner spiral ends of said first and second coils directly through said member, a third flat spiral coil positioned on said other one of said sides, said third coil having an outer spiral end and an inner spiral end, said third coil having the turns thereof spiralled in the same direction as the turns of said second coil, and having its outer end connected to the outer end of said second coil, a fourth flat spiral coil positioned on said one of said sides, said fourth coil having an outer spiral end and an inner spiral end, said fourth coil having the turns thereof spiralled in the same direction as the turns of sair first coil, a second connection means coupling said inner spiral ends of said third and fourth coils directly through said member, a terminal element positioned on said member, a first capacitor having two leads, one of which is directly connected to said terminal element and the other of which is directly connected to said inner spiral ends of said first and second coils, a second capacitor having two leads, one of which is directly connected to said terminal element and the other of which is directly connected to said inner spiral ends of said third and fourth coils, a pair of input circuit elements including said terminal element and the outer spiral end of said first coil, and a pair of output circuit elements including said terminal element and the outer spiral end of said fourth coil.

2. A signal transmission line as set forth in claim 1 wherein each of said spiral coils is formed as a printed circuit element on said support member, and each of said inner spiral ends has a terminal means connected thereto to form output taps on said line.

3. A signal transmission line comprising a flat support member having a pair of parallel sides and formed of an insulating material, the thickness dimension of said member between said parallel sides being relatively small, a first flat spiral coil positioned on one of said sides, said coil having an outer spiral end and an inner spiral end, a second flat spiral coil positioned on the other one of said sides, said second coil having an outer spiral end and an inner spiral end, said second coil being formed with the turns thereof spiralled in the opposite direction from the turns of said first coil, as viewed from the same side of said support member, and positioned to be inductively coupled to said first coil through said support member, a first connection means coupling said inner spiral ends of said first and second coils directly through said member, a third flat spiral coil positioned on said other one of said sides, said third coil having an outer spiral end and an inner spiral end, said third coil having the turns thereof spiralled in the opposite direction from the turns of said second coil, and having its outer end connected to the outer end of said second coil, a fourth flat spiral coil positioned on said one of said sides, said fourth coil having an outer spiral end and an inner spiral end, said fourth coil having the turns thereof spiralled in the opposite direction from the turns of said first coil, a second connection means coupling said inner spiral ends of said third and fourth coils directly through said member, a terminal element positioned on said member, a first capacitor having two leads, one of which is directly connected to said terminal element and the other of which is directly connected to said inner spiral ends of said first and second coils, a second capacitor having two leads, one of which is directly connected to said terminal element and the other of which is directly connected to said inner spiral ends of said third and fourth coils, a pair of input circuit elements including said terminal element and the outer spiral end of said first coil, and a pair of output circuit elements including said terminal element and the outer spiral end of said fourth coil.

4. A signal transmission line as set forth in claim 3 wherein each of said spiral coils is formed as a printed circuit element on said support member, each of said inner spiral ends having terminal means connected thereto to form output taps on said line.

5. Signal transmission apparatus comprising a support member, a pair of substantially flat spiral coils each having an inner and an outer end, said pair of coils being disposed for mutual coupling on opposite sides of said support member and being spiralled in opposite directions as viewed from one side of said support member, means for joining the inner ends of said pair of coils through said support member, capacitive means coupled between the junction of said pair of coils and a reference connection, means for applying an input signal between the outer end of one of said paired coils and said reference connection, and means for deriving an output signal between the outer end of the other of said paired coils and said reference connection.

References Cited

UNITED STATES PATENTS

| | | | |
|---|---|---|---|
| 2,611,807 | 9/1952 | Lazzery | 334—50 X |
| 3,231,894 | 1/1966 | Nagai | 343—806 |

HERMAN KARL SAALBACH, *Primary Examiner.*

T. J. VEZEAU, *Assistant Examiner.*

U.S. Cl. X.R.

333—84; 336—200